(12) United States Patent
Nomura

(10) Patent No.: US 9,601,438 B2
(45) Date of Patent: Mar. 21, 2017

(54) SEMICONDUCTOR DEVICE AND METHOD FOR MANUFACTURING THE SAME

(71) Applicant: KABUSHIKI KAISHA TOSHIBA, Minato-ku (JP)

(72) Inventor: Taizo Nomura, Nagoya (JP)

(73) Assignee: KABUSHIKI KAISHA TOSHIBA, Minato-ku (JP)

( * ) Notice: Subject to any disclaimer, the term of this patent is extended or adjusted under 35 U.S.C. 154(b) by 0 days.

(21) Appl. No.: 14/206,483

(22) Filed: Mar. 12, 2014

(65) Prior Publication Data

US 2014/0284775 A1    Sep. 25, 2014

(30) Foreign Application Priority Data

Mar. 22, 2013 (JP) ................................. 2013-059350
Dec. 13, 2013 (JP) ................................. 2013-258043

(51) Int. Cl.
*H01L 23/552* (2006.01)
*H01L 23/31* (2006.01)
(Continued)

(52) U.S. Cl.
CPC .......... *H01L 23/552* (2013.01); *H01L 21/561* (2013.01); *H01L 23/3128* (2013.01);
(Continued)

(58) Field of Classification Search
CPC . H01L 23/552; H01L 23/554; H01L 23/3128; H01L 24/49; H01L 2224/859; H01L 2224/48145; H01L 21/561; H01L 23/544; H01L 24/85; H01L 24/97; H01L 25/0657; H01L 2223/54433; H01L 2223/54486; H01L 2224/32145
(Continued)

(56) References Cited

U.S. PATENT DOCUMENTS 4,920,074 A * 4/1990 Shimizu .............. H01L 21/4821
228/180.21
6,420,790 B1    7/2002 Koizumi
(Continued)

FOREIGN PATENT DOCUMENTS

CN    102790019 A    11/2002
CN    1755929 A    4/2006
(Continued)

OTHER PUBLICATIONS

Office Action issued Jul. 29, 2014 in Japanese Patent Application No. 2013-258043 (with English language translation).
(Continued)

*Primary Examiner* — Jarrett Stark
*Assistant Examiner* — Shahed Ahmed
(74) *Attorney, Agent, or Firm* — Oblon, McClelland, Maier & Neustadt, L.L.P.

(57) ABSTRACT

According to one embodiment, there is disclosed a semiconductor device which has a wiring substrate, a semiconductor element mounted on the wiring substrate, a molding resin which seals the semiconductor element, and a shield layer provided on the molding resin, wherein the molding resin has a marking portion by laser irradiation on a surface, and the shield layer is provided on the molding resin having the marking portion.

7 Claims, 2 Drawing Sheets

(51) Int. Cl.
*H01L 21/56* (2006.01)
*H01L 23/544* (2006.01)
*H01L 25/065* (2006.01)
*H01L 23/00* (2006.01)

(52) U.S. Cl.
CPC ............ *H01L 23/544* (2013.01); *H01L 24/49* (2013.01); *H01L 24/85* (2013.01); *H01L 24/97* (2013.01); *H01L 25/0657* (2013.01); *H01L 24/32* (2013.01); *H01L 24/73* (2013.01); *H01L 2223/54433* (2013.01); *H01L 2223/54486* (2013.01); *H01L 2224/32145* (2013.01); *H01L 2224/32225* (2013.01); *H01L 2224/48145* (2013.01); *H01L 2224/48227* (2013.01); *H01L 2224/49052* (2013.01); *H01L 2224/73265* (2013.01); *H01L 2224/859* (2013.01); *H01L 2224/97* (2013.01); *H01L 2225/0651* (2013.01); *H01L 2225/06506* (2013.01); *H01L 2225/06537* (2013.01); *H01L 2225/06562* (2013.01); *H01L 2924/00014* (2013.01); *H01L 2924/12042* (2013.01); *H01L 2924/15311* (2013.01); *H01L 2924/15787* (2013.01); *H01L 2924/15788* (2013.01); *H01L 2924/181* (2013.01); *H01L 2924/1815* (2013.01)

(58) Field of Classification Search
USPC ...... 257/787, 666, 788, 659; 438/25, 26, 64, 438/112, 124, 731
See application file for complete search history.

(56) References Cited

U.S. PATENT DOCUMENTS

| 8,026,589 | B1 | 9/2011 | Kim et al. | |
| 8,138,584 | B2* | 3/2012 | Wang | H01L 21/561 |
| | | | | 257/659 |
| 2004/0038510 | A1* | 2/2004 | Munakata | H01L 21/561 |
| | | | | 438/613 |
| 2009/0256244 | A1 | 10/2009 | Liao et al. | |
| 2010/0230789 | A1 | 9/2010 | Yorita et al. | |
| 2012/0015687 | A1 | 1/2012 | Yamada et al. | |
| 2012/0295668 | A1* | 11/2012 | Kitahara | H01L 23/544 |
| | | | | 455/571 |
| 2013/0194756 | A1* | 8/2013 | Aso | H05K 9/0045 |
| | | | | 361/728 |
| 2014/0011453 | A1* | 1/2014 | Kuroda | H01L 21/58 |
| | | | | 455/41.2 |

FOREIGN PATENT DOCUMENTS

| JP | 2000-156434 A | 6/2000 |
| JP | 2001-160604 A | 6/2001 |
| JP | 2005-072392 A | 3/2005 |
| JP | 2007-67205 A | 3/2007 |
| JP | 2008-515189 A | 5/2008 |
| JP | 2010-219210 A | 9/2010 |
| JP | 2010-278334 | 12/2010 |
| JP | 2012-243895 A | 12/2012 |

OTHER PUBLICATIONS

Office Action issued Nov. 4, 2014 in Japanese Patent Application No. 2013-258043 (with English language translation).
Decision of Refusal and Decision to Dismiss Amendment issued Feb. 17, 2015 in Japanese Patent Application No. 2013-258043 (with English language translation).
Notice of Reasons for Refusal issued Apr. 28, 2015 in Japanese Patent Application No. 2014-198565 (with English language translation).
Taiwanese Office Action issued Aug. 25, 2015 in Patent Application No. 103104612 (with English Translation).
Office Action mailed May 19, 2016 in Chinese Application No. 201410050906.4 (w/English translation).

* cited by examiner

0
SEMICONDUCTOR DEVICE AND METHOD FOR MANUFACTURING THE SAME

CROSS REFERENCE TO RELATED APPLICATIONS

This application is based upon and claims the benefit of priority from the prior Japanese Patent Applications No. 2013-059350 filed on Mar. 22, 2013 and No. 2013-258043 filed on Dec. 13, 2013; the entire contents of all of which are incorporated herein by reference.

FIELD

Embodiments described herein relate generally to a semiconductor and a method for manufacturing the same.

BACKGROUND

In a portable radio communication device such as a cellular phone, it is recently a considerable problem to avoid interference of an electromagnetic noise emitted from each embedded electronic component to a radio system. As a measure to suppress such a noise, a method has been conventionally general in which a circuit that includes a source is enclosed with a metal sheet (sheet metal shield). However, this method has a problem of causing increase in size and height of a device.

Thus, it is studied to apply a shielding measure to the electronic component itself being the source, and a package (hereinafter, referred to as a shield semiconductor package) in which a shield layer is provided on a surface of a resin-shielded semiconductor package by plating is developed. In such a semiconductor package, a component itself can be shielded and, in addition, a shield layer can be formed to be very thin, which leads to further decrease in size and thickness of the device.

However, on the other hand, there is a possibility that a shield performance is impaired at a time that product information is marked by a laser, due to penetration through the shield layer. Further, if a depth of marking is decreased for the purpose of preventing such penetration, visibility is deteriorated.

DETAILED DESCRIPTION

According to one embodiment, there is disclosed a semiconductor device which has a wiring substrate, a semiconductor element mounted on the wiring substrate, a molding resin which seals the semiconductor element, and a shield layer provided on the molding resin. The molding resin has a marking portion by laser irradiation on a surface, and the shield layer is provided on the molding resin having the marking portion.

Various embodiments will be described hereinafter with reference to the accompanying drawings.

Figure 1:
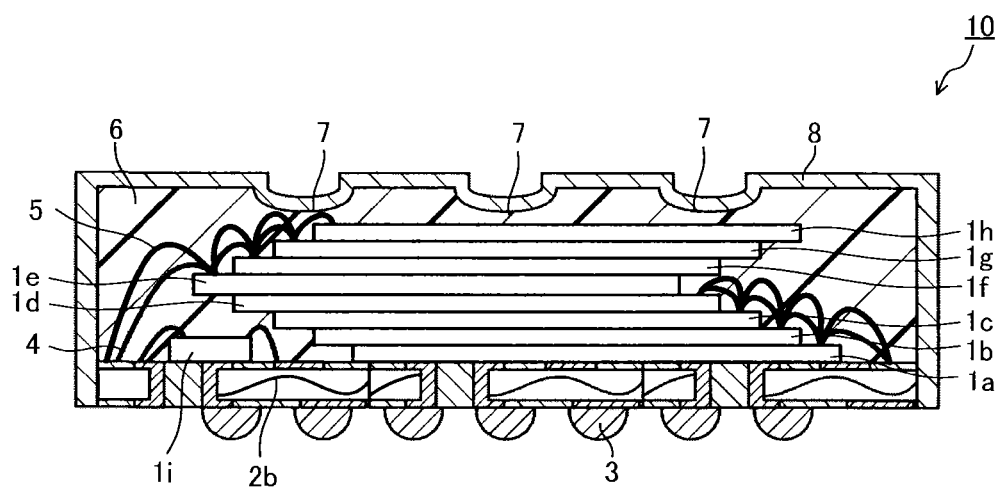
FIG. 1 is a cross-sectional view showing a structure of a semiconductor device according to one embodiment.

A semiconductor device (semiconductor package) 10 shown in FIG. 1 is what is called a stacked semiconductor device. A plurality of semiconductor elements (semiconductor chips) $1a$, $1b$, $1c$, ..., $1h$ is stacked in multiple stages on a wiring substrate 2. Other than the above, one semiconductor element $1i$ is mounted on the wiring substrate 2. The number of the stacked semiconductor elements is eight in an example of FIG. 1, that is, the semiconductor elements are stacked in eight stages, but the number of stacks of the semiconductor elements is not limited in particular, and, for example, 1-layer, 2-layer, 5-layer, 16-layer, 32-layer, and so on are possible. In the example of FIG. 1, the semiconductor elements $1a$ to $1h$ stacked in eight stages are a NAND flash, while the semiconductor element $1i$ mounted separately on the wiring substrate 2 is a NAND controller. The semiconductor device 10 has a function equivalent to a storage unit such as a memory card and an SSD, for example.

A semiconductor substrate such as a silicon substrate is used for each of the plural semiconductor elements $1a$ to $1i$. On the other hand, for the wiring substrate 2, there is used a multilayer wiring substrate in which an insulating substrate such as a resin substrate, a ceramics substrate, and a glass substrate, for example, is used as a substrate. Examples of the wiring substrate 2 to which the resin substrate is applied include a general multilayer copper clad laminate (multilayer printed wiring board) or the like. The wiring substrate 2 is provided, on its lower surface, with an electrode pad for connection to the outside, and an external electrode 3 such as a solder bump is fixed thereon. The wiring substrate 2 is provided, on its upper surface, with a surface wiring layer $2a$ which includes a signal pattern and a ground pattern. The semiconductor elements $1a$ to $1i$ are each connected to the signal pattern and the ground pattern via a signal line wire 4 and a ground wire 5. An inner layer wiring layer $2b$ connected to the surface wiring layer $2a$ and the electrode pad of an external electrode 3 is provided inside the wiring substrate 2.

On an upper surface of the wiring substrate 2 on which the plural semiconductor elements $1a$ to $1i$ are mounted, a molding resin 6 is molded in a manner to cover the semiconductor elements $1a$ to $1i$, the surface wiring layer $2a$ provided on the upper surface of the wiring substrate 2, and the signal line wire 4 and the ground wire 5 which connect the semiconductor elements $1a$ to $1i$ and the surface wiring layer $2a$. The molding resin 6 seals the semiconductor elements $1a$ to $1i$, the surface wiring layer $2a$, the signal line wire 4, the ground wire 5, and so on, to form an insulating layer, for which an epoxy resin containing a filler such as carbon black is used, for example.

Product information such as a product number, a date of manufacture, and a manufacturing plant is inscribed on the surface of the molding resin 6 by laser irradiation (In FIG. 1, a reference 7 indicates a marking portion formed by inscribing by laser irradiation). On an entire inscribed surface of the molding resin 6, that is, on an upper surface and a side surface, and further, on a side surface of the wiring substrate 2 continued to the side surface of the molding resin 6, a shield layer 8 is formed by metal plating or metal sputtering. The shield layer 8 is for shielding an electromagnetic noise emitted mainly from the semiconductor elements $1a$ to $1i$. Therefore, the shield layer 8 is electrically connected to the external electrode for grounding provided on the lower surface of the wiring substrate 2, and thereby a shielding performance is secured.

A metal material for forming the shield layer 8 is not limited in particular, and Cu, Ni, Cr, or an Ni alloy containing B, Co or W, or the like may be used. The shield layer 8 may be of a single layer or of a stacked structure having a plurality of layers. A thickness of the shield layer 8 is not limited in particular, but it is preferable to make the thickness as small as possible in order for a smaller and thinner semiconductor device 10. By making the thickness of the shield layer 8 small, visibility of the marking portion 7 may be increased. In other words, if the thickness of the shield layer 8 is increased, a depth of inscribing by laser irradiation may be decreased and visibility may be deteriorated. Increasing the thickness of the shield layer 8 may prevent such deterioration of visibility. However, if the shield layer 8 is too thin, a mechanical strength thereof is reduced, and there is a possibility that a shield performance may be reduced due to peeling of a part of the shield layer 8 and so on. From the above view point, it is preferable that the shield layer 8 is in a range of 2 to 4 μm.

For example, when the depth of inscribing of the marking portion 7 is about 30 μm, the shield layer 8 may be constituted with a 3 μm-thick 2-layer structure of a Ni layer and a Cu layer.

With regard to marking by a laser, a YAG laser or a $YVO_4$ (yittrium vanadate) laser, or the like is preferably used since a spot diameter thereof is small and inscribing with a depth of about 30 μm may be formed. For example, the YAG laser with a spot diameter of 0.1 mm may be used.

Though not shown, in the present embodiment, it is possible to configure that a loop top portion of the ground wire 5 embedded in the molding resin 6 is made to contact the shield layer 8. By making the ground wire 5 contact the shield layer 8, it is possible to strengthen ground of the semiconductor device 10 and to further improve the shield performance. In order to make the loop top portion of the ground wire 5 contact the shield layer 8, as will be described later, for example, in connecting the ground wire 5, a loop height is set to be higher than a loop height of the signal line wire 4, in other words, a position of the loop top portion of the ground wire 5 is set to be higher than a position of a loop top portion of the signal line wire 4, and, in applying marking by a laser, the loop top portion of the ground wire 5 is exposed. As a result that the shield layer 8 is formed on the molding resin 6 in which the ground wire 5 is exposed, the ground wire 5 may be made to contact the shield layer 8. Note that in such a case, it is preferable that a transparent or translucent material which allows looking inside therethrough is used for a material of the molding resin 6. Thereby, it is possible to check a position of the ground wire 5 to be exposed, its loop top portion in particular, and to expose the ground wire 5 surely and appropriately in laser marking.

Further, in another example of the present embodiment, it is possible to form a shield layer 8 on a wiring substrate 2 in whose side surface a ground pattern cross-section is exposed. In this case, the ground pattern is formed in advance in a manner to stride over a visible outline of the semiconductor device 10 and later-described separation is performed to cut the ground pattern, and thereby it is possible to expose the ground pattern cross-section in the side surface of the wiring substrate 2 in a state before formation of the shield layer 8.

According to the semiconductor device of the present embodiment, since the shield layer 8 is formed on the surface of the molding resin 6 on which the marking portion 7 is formed by laser irradiation, increase in size and height of the device is suppressed and excellent visibility of the marking portion 7 and a highly reliable shield performance may be had. Further, if the ground wire 5 is made to contact the shield layer 8, grounding may be enhanced and the shield performance may be further improved.

Next, an example of a method for manufacturing the semiconductor device 10 according to the embodiment will be described by using a flowchart shown in FIG. 2.

Figure 2:
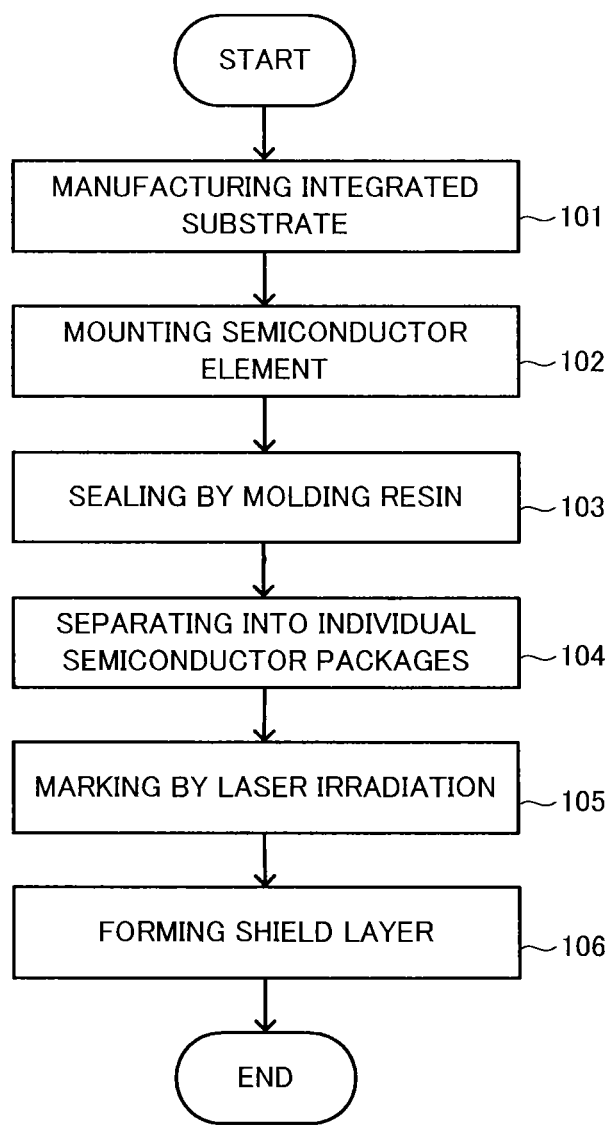
FIG. 2 is a diagram showing a process flow of a method for manufacturing the semiconductor device according to the one embodiment.

As shown in FIG. 2, process steps are constituted mainly by the following six steps: the manufacturing an integrated substrate (101); the mounting a semiconductor element (102): the sealing by a molding resin (103); the separating into individual semiconductor devices (104); the applying marking by laser irradiation (105); and the forming a shield layer (106).

First, in the manufacturing step (101), an integrated substrate having a plurality of the wiring substrates 2 arranged in a matrix is fabricated.

Next, in the mounting step (102), semiconductor elements 1a, 1b, 1c, . . . , 1h are stacked in sequence on an upper surface of each wiring substrate described above, a semiconductor element 1i is mounted, and a signal pattern and a ground pattern provided in the wiring substrate 2 are connected to the respective semiconductor elements 1a to 1i via a signal line wire 4 and a ground wire 5. On that occasion, with regard to the ground wire 5 and the signal line wire 4, it is preferable that a loop top portion of the ground wire 5 is positioned higher than a loop top portion of the signal line wire 4. Thereby, it becomes possible to make the ground wire 5 contact a shield layer 8 easily in the later step, and it becomes possible to enhance grounding and furthermore to improve a shield performance.

Next, in the sealing step by the molding resin (103), a molding resin 6, for example, an epoxy resin, is molded collectively on a upper surface of the integrated substrate on which semiconductor elements 1a to 1i are mounted, so that the semiconductor elements 1a to 1i are sealed. For molding of the molding resin 6, a molding process such as transfer molding, compression molding, potting, and printing can be used.

Next, in the separating step (104), in order to fabricate individual semiconductor devices 10, the molding resin 6 is cut together with the integrated substrate, to be separated into a plurality of the wiring substrates 2 on which the semiconductor elements 1a to 1i are mounted. A blade such as a diamond blade can be used for cutting.

Next, in the marking step (105), product information such as a product name, a product number, a date of manufacture, and a manufacturing plant is inscribed on an upper surface of the molding resin 6 on the wiring substrate 2 by using a laser marking device equipped with a laser such as a YAG laser. From a view point of obtaining better visibility and workability, a depth of inscribing is preferably about 20 to 40 μm, more preferably about 25 to 35 μm, and is even more preferably about 30 μm.

It is preferred that the inscribing is performed in a manner that a loop top portion of the ground wire 5 in the molding resin 6 is exposed. For that purpose, it is preferable to adjust a loop height of the ground wire 5 in advance when the ground wire 5 is connected in the mounting step (102). Further, it is preferred that a position of the loop top portion of the ground wire 5 is recognized by a camera or the like attached to a laser marking device before irradiation of a laser and that laser irradiation is performed after alignment correction. By carrying out such alignment correction, the loop top portion of the ground wire 5 may be exposed surely. In other words, in the ground wire 5, the position of the loop top portion may change due to resin flow in the sealing step (103). Therefore, as a result that the changed position is recognized by the camera or the like and alignment correction is carried out, the loop top portion of the ground wire 5 may be exposed surely. Note that a material allowing seeing therethrough is necessary to be used as a material for the molding resin 6 in a case where the position of the loop top portion of the ground wire 5 is to be recognized by the camera or the like.

Next, in the shield layer forming step (106), metal plating or metal sputtering is applied to an entire surface of the molding resin 6 having been subjected to laser marking, that is, to an entire upper surface and side surface, to form a shield layer 8 with a thickness of 3 μm, for example. Thereby, the semiconductor device 10 as shown in FIG. 1 is fabricated.

Note that when metal plating or metal sputtering is applied, it is preferred that the surface of the molding resin 6, at least its upper surface, is coarsened in advance, in order to improve adhesion of the shield layer 8 to the molding resin 6. In the present method, for the purpose of obtaining multiple semiconductor devices, the collectively sealed molding resin is cut. Thus the side surface of the molding resin 6 is already coarsened by cutting and basically is not necessary to be coarsened, but a coarsening step may be further added if necessary. For coarsening, a technique such as honing may be used, but a laser irradiation is preferred since the laser device used in the marking step (105) can be used as a coarsening device, making it unnecessary to separately prepare a device for coarsening, and leading to simpler steps and a shorter step period.

The coarsening step may be carried out before or after the marking step (105), but it is preferable to carry out the coarsening step before the marking step (105) in view of visibility of a marking portion 7. If the coarsening step is carried out after the marking step (105), a depth of inscribing by the laser is decreased and visibility is deteriorated.

According to the method for manufacturing the semiconductor device described above, since the shield layer is formed by metal plating or metal sputtering, the shield layer with a quite small thickness can be formed and the semiconductor device can be made smaller and thinner.

Moreover, since the shield layer is formed after the product information or the like is marked on the surface of the molding resin by the laser, a highly reliable shield performance can be had and a marking portion having sufficient visibility can be formed. In other words, if laser marking is performed after formation of the shield layer, there is a possibility that penetration of a shield layer by the laser occurs, deteriorating shield. Further, if penetration does not occur, inscribing is too shallow to obtain visibility. In the above-described method for manufacturing the semiconductor device, since the shield layer is formed after laser marking, there is no possibility for the shield layer to be penetrated, and inscribing with a sufficient depth is possible. Therefore, it is possible to have a highly reliable shield performance and to form a marking portion having sufficient visibility.

Further, if laser marking is performed after formation of the shield layer, a laser output is required to be large since a metal generally has a large laser reflectivity, and thus a laser material is consumed much and frequent exchange is necessary. However, in the above-described method, since marking is performed to the molding resin, which exhibits good absorption of laser light, a laser output can be small and frequent exchange is not necessary, leading to reduction of a manufacturing cost and improvement of an operation efficiency.

While certain embodiments have been described, these embodiments have been presented by way of example only, and are not intended to limit the scope of the inventions. Indeed, the novel embodiments described herein may be embodied in a variety of other forms; furthermore, various omissions, substitutions, and changes in the form of the embodiments described herein may be made without departing from the spirit of the inventions. The accompanying claims and their equivalents are intended to cover such forms or modifications as would fall within the scope and spirit of the inventions.

What is claimed is:

1. A method for manufacturing semiconductor devices, the method comprising:
    mounting semiconductor elements on a wiring substrate;
    sealing the semiconductor elements by a molding resin;
    cutting the molding resin together with the wiring substrate into individual semiconductor devices, the cut surfaces of the molding resin being coarsened by the cutting;
    coarsening an uncut surface of the molding resin after the cutting;
    inscribing an inscription including product information on the coarsened part of the uncut surface of the molding resin by laser irradiation; and
    forming a shield layer on the coarsened surfaces of the molding resin, the coarsened surfaces including the uncut surface on which the inscription is applied, and the cut surfaces.

2. The method according to claim 1,
    wherein the coarsening is performed by laser irradiation.

3. The method according to claim 1,
    wherein the inscription is applied on the coarsened part of the uncut surface of the molding resin in a manner that at least a part of a ground wire connected to the element is exposed.

4. The method according to claim 1,
    wherein a position of a ground wire connected to the element is checked via the molding resin, and
    wherein the inscription is applied based on the checked position.

5. The method according to claim 1,
    wherein in the mounting of the semiconductor elements, when connecting a ground pattern provided in the wiring substrate to the semiconductor element via a ground wire, a loop height of the ground wire is adjusted.

6. The method according to claim 1,
    wherein in the mounting of the semiconductor elements, a ground pattern and a signal pattern provided in the wiring substrate are each connected to the semiconductor element via a ground wire and a signal wire, in a manner that a loop top portion of the ground wire is positioned higher than a loop top portion of the signal line wire.

7. The method according to claim 1,
    wherein the cutting is performed in a manner that a ground pattern cross-section in a side surface of the substrate after the cutting is exposed.

* * * * *